(12) United States Patent  
Okada et al.

(10) Patent No.: US 6,744,562 B2  
(45) Date of Patent: Jun. 1, 2004

(54) PELLICLE

(75) Inventors: Kaname Okada, Yokohama (JP); Shinya Kikugawa, Tokyo (JP)

(73) Assignee: Asahi Glass Company, Limited, Tokyo (JP)

( * ) Notice: Subject to any disclaimer, the term of this patent is extended or adjusted under 35 U.S.C. 154(b) by 137 days.

(21) Appl. No.: 10/206,086

(22) Filed: Jul. 29, 2002

(65) Prior Publication Data

US 2003/0035222 A1 Feb. 20, 2003

(30) Foreign Application Priority Data

Jul. 30, 2001 (JP) ........................................ 2001-229527

(51) Int. Cl.$^7$ ........................... G02B 27/14; G03B 27/42
(52) U.S. Cl. ........................... 359/629; 359/738; 355/53
(58) Field of Search ................................ 359/629, 738, 359/808; 355/53; 430/5; 428/14

(56) References Cited

U.S. PATENT DOCUMENTS

| | | | | |
|---|---|---|---|---|
| 6,475,575 B1 | * | 11/2002 | Ikuta et al. | 428/14 |
| 6,566,018 B2 | * | 5/2003 | Muzio et al. | 430/5 |
| 2002/0090558 A1 | * | 7/2002 | Shirasaki | 430/5 |

* cited by examiner

*Primary Examiner*—Georgia Epps  
*Assistant Examiner*—M. Hasan  
(74) *Attorney, Agent, or Firm*—Oblon, Spivak, McClelland, Maier & Neustadt, P.C.

(57) ABSTRACT

A pellicle comprising a box-shaped pellicle frame having top and bottom openings, and a pellicle sheet bonded to the pellicle frame to cover one of the openings of the pellicle frame, wherein the pellicle frame is made of quartz glass, a plurality of vent holes are formed as distributed on opposing side walls of the pellicle frame, and the size of the vent holes in the direction of the height of the pellicle frame is at most $\frac{3}{5}$ of the height of the pellicle frame.

9 Claims, 2 Drawing Sheets

PELLICLE

BACKGROUND OF THE INVENTION

1. Field of the Invention

The present invention relates to a pellicle. Particularly it relates to a pellicle to be used for the production of semiconductor devices such as LSI, ultra LSI, etc., or liquid crystal display devices, which is particularly suitable for photolithography employing a light having a wavelength of at most 220 nm (especially a wavelength of at most 180 nm).

2. Discussion of Background

In recent years, along with high integration of semiconductor devices, there has been a progress in shortening the wavelength of an exposure light to be used for photolithography in the production process. Namely, to draw an integrated circuit pattern on a wafer, a technique is required whereby a fine circuit pattern can be drawn with a narrower line width. To satisfy such a requirement, a light with a shorter wavelength than the conventional g-line (wavelength: 436 nm) or i-line (wavelength: 365 nm), such as a KrF excimer laser (wavelength: 248 nm), an ArF excimer laser (wavelength: 193 nm) or a $F_2$ laser (wavelength: 157 nm), is now being used as an exposure light for a stepper for photolithography.

In photolithography, a method of mounting a pellicle on one side or on each side of a photomask, as a dust proof for the surface of the photomask, is adopted. If scratches or foreign matters are present on the photomask to be used for the exposure, such scratches or foreign matters will be printed on a wafer together with a pattern, thus causing a short circuit or breaking of the circuit, etc.

Here, the pellicle is meant for one formed into a container shape by bonding a pellicle sheet to a pellicle frame to cover a top opening of the frame. The pellicle comprises a flat pellicle sheet (in this specification, it includes both a membrane-shaped one made of an organic resin and a sheet-shaped one made of e.g. synthetic quartz glass), and a pellicle frame having a predetermined thickness to have the pellicle sheet distanced from the photomask and is one formed into a container shape by bonding a pellicle sheet to the upper face of the pellicle frame. For the pellicle frame, an aluminum having alumite treatment applied to the surface, is employed.

Further, usually, vent holes are formed on the pellicle frame, so that air permeability is secured in a state where the pellicle is mounted on a photomask, thereby to minimize the influence over the pellicle sheet of the changes in the temperature or in the pressure of the external atmosphere.

Further, with a pellicle for a $F_2$ laser, it is necessary to replace the internal atmosphere of the pellicle with an inert gas atmosphere. The conventional photolithographic process has been carried out in the atmosphere. However, in a case where a $F_2$ laser is used for exposure, it is necessary to carry out the exposure in an inert gas atmosphere, since oxygen molecules in the atmosphere have absorption at the exposure wavelength of 157 nm.

JP-A-2001-133961 discloses a method for positively replacing the internal atmosphere of the pellicle. Here, an inert gas is introduced into the interior of the pellicle by connecting an inert gas steel bottle to a hole.

However, the conventional vent hole size is not sufficiently large for replacement of the internal atmosphere simply by blowing an inert gas. Conventional vent holes were used to adjust the pressure, and the size was small as compared with the height of the pellicle frame. For example, the size of vent holes was about 0.5 mm, while the height of the pellicle frame made of aluminum was about 5 mm.

On the other hand, when a pellicle is mounted on a photomask, it is important that the entire bottom face of the pellicle frame is bonded to the photomask in close contact without any clearance and sealed not to have a clearance for permitting dust, etc, formed. For such sealing, a pressure sensitive adhesive may be coated on the end face of the pellicle frame on the photomask side, or the pellicle frame is mounted on the photomask by means of a pressure sensitive adhesive tape. At that time, by means of a pellicle mounter, a load of at least 30 kg may be exerted to the upper portion of the pellicle to increase the sealing degree.

By a study by the present inventors, it has been found that the exposure pattern may have a distortion if vent holes are enlarged in order to let the pellicle atmosphere be replaced passively. Namely, the frame may have a distortion by the load at the time of mounting the pellicle to the photomask. Further, at the time of drilling the pellicle frame to form vent holes, a residual stress is likely to remain in the pellicle frame, whereby the flatness of the upper and bottom faces of the pellicle frame may deteriorate. If a photomask after mounting the pellicle, has a distortion for such a reason, the exposed pattern tends to be a double exposure, or the exposure position is likely to shift, thus causing a failure. Especially, the pressure required to mount a pellicle on a photomask, increases as the photomask is large-sized, and the possibility of a failure due to such distortion is increasing.

SUMMARY OF THE INVENTION

It is an object of the present invention to facilitate replacement of the atmosphere in the pellicle by simple blowing of an inert gas and to obtain a pellicle which will not have a distortion of the exposure pattern. Namely, it is an object of the present invention to reduce the deterioration in strength of the pellicle and to provide a pellicle having the inert gas replacement speed improved, by optimizing the structure of the above-mentioned vent holes.

The present invention has been made to solve the above-mentioned problems, and it provides a pellicle comprising a box-shaped pellicle frame having top and bottom openings, and a pellicle sheet bonded to the pellicle frame to cover one of the openings of the pellicle frame, wherein the pellicle frame is made of quartz glass, a plurality of vent holes are formed as distributed on opposing side walls of the pellicle frame, and the size of the vent holes in the direction of the height of the pellicle frame is at most ⅗ of the height of the pellicle frame.

According to the present invention, the pellicle frame is made of quartz glass, a plurality of vent holes are distributed on opposing side walls of the pellicle frame, and the size of the vent holes in the direction of the height of the pellicle frame is at most ⅗ of the height of the pellicle frame, whereby it is possible to reduce the distortion of the pellicle due to the load at the time of mounting and to reduce a deformation of the pellicle frame due to the residual stress formed by the processing to form the vent holes. Further, replacement of the atmosphere in the pellicle by simple blowing of an inert gas, can be facilitated.

DETAILED DESCRIPTION OF THE PREFERRED EMBODIMENTS

Figure 1:
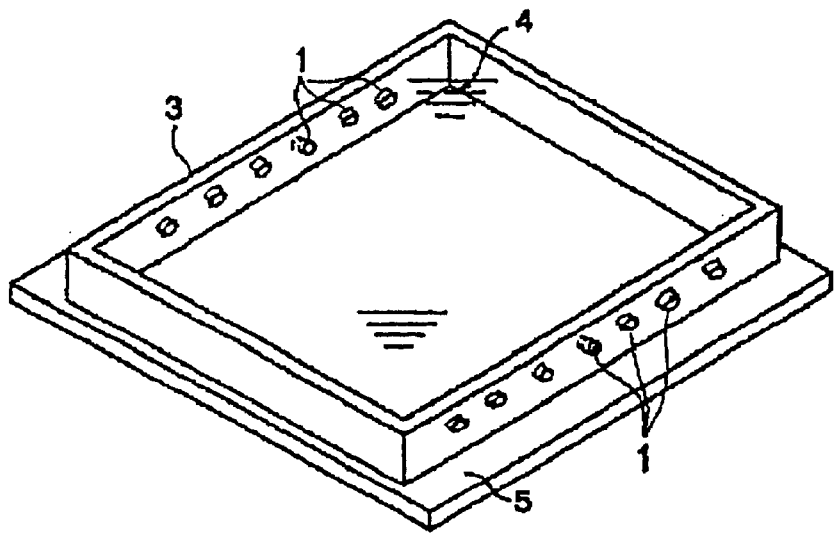
FIG. 1 is a perspective view showing an embodiment of the present invention.

FIG. 1 is a perspective view showing an embodiment of the pellicle of the present invention. On the upper face of the pellicle frame 3, a pellicle sheet 4 made of a flat transparent quartz glass, is bonded. The pellicle frame 3 and the pellicle sheet 4 constitute a pellicle. As shown in FIG. 1, the pellicle is to be used as mounted on a photomask 5 by e.g. an adhesive.

In the present invention, quartz glass is used as the material for the pellicle frame. Accordingly, it is possible to minimize the residual stress caused by the processing to form vent holes, and it is thereby possible to reduce a distortion of the photomask after the pellicle is mounted on the photomask. Further, the quartz glass has higher rigidity as compared with conventional aluminum. Accordingly, the size of vent holes on the side walls of the pellicle frame can be made large, whereby replacement of the internal atmosphere of the pellicle can be carried out efficiently. When used for a $F_2$ laser, the pellicle sheet is preferably made of a synthetic quartz glass having high durability against vacuum ultraviolet rays.

In the present invention, a plurality of vent holes 1 are formed as distributed on opposing side walls of the pellicle frame 3. The vent holes formed on the opposing side walls of the pellicle frame are such that those formed on one side wall will function as gas inlet holes, and those on the other side wall will function as gas outlet holes. The vent holes 1 are provided in plurality on each of the opposing side walls of the pellicle frame 3, whereby the replacement efficiency is improved. Through these holes, an inert gas is introduced into the pellicle, and the internal gas of the pellicle is discharged, whereby the atmosphere in the space at the interior of the pellicle defined by the pellicle sheet 4, the pellicle frame 3 and the photomask 5, can be replaced by the inert gas, and the oxygen partial pressure can be lowered.

The shape of the vent holes is not particularly limited. However, in order to minimize the pressure loss of the gas, the shape of vent holes is preferably circular. If the shape is circular, the rate for replacement of the internal atmosphere of the pellicle by the inert gas, can be improved, whereby it is possible to accomplish shortening of the inert gas replacement time and reduction of the amount of the inert gas to be used.

Figure 2:
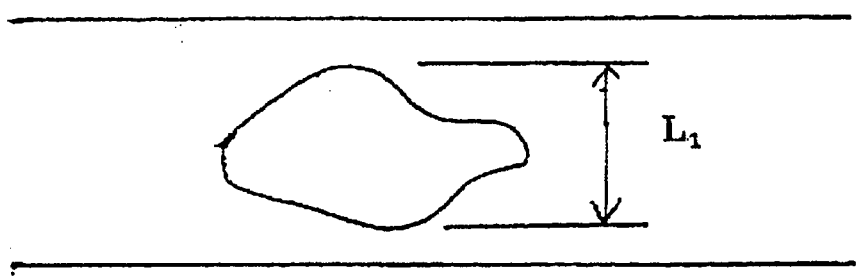
FIG. 2 is a schematic view illustrating the definition of the size of vent holes in the direction of the height of a pellicle frame.
Figure 3:
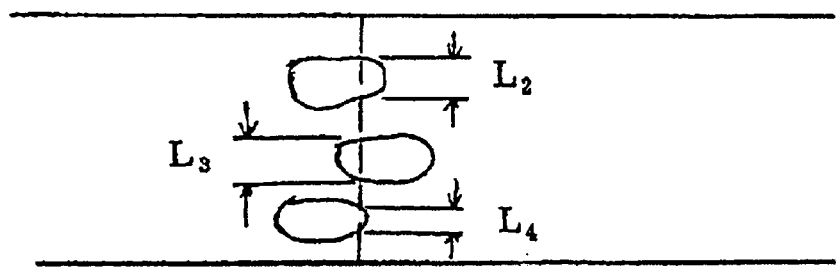
FIG. 3 is a schematic view illustrating the definition of the size of vent holes in the direction of the height of a pellicle frame.

If the shape of a vent hole is not circular, the size of such a vent hole in the direction of the height of the pellicle frame in the present invention, can be defined as $L_1$ shown in FIG. 2. Further, in a case where a plurality of vent holes are formed in the direction of the height of the pellicle frame, the size of the vent holes in the direction of the height of the pellicle frame in the present invention, is defined by the total of the sizes in the height direction ($L_2+L_3+L_4$) as shown in FIG. 3.

The size of the vent holes in the direction of the height of the pellicle frame is at most ⅗ of the height of the pellicle frame, preferably at most ½ of the height of the pellicle frame.

On the other hand, the size of the vent holes in the direction of the height of the pellicle frame is preferably at least ⅕ of the height of the pellicle frame. If the size is smaller than this, it tends to take too much time for replacement of the gas.

It is preferred that the vent holes are formed at positions such that the interior gas of the pellicle will be replaced in a short time. Namely, it is preferred that taking into consideration the flow of the gas in the interior of the pellicle at the time of introduction of the gas, such holes are formed at positions such that the interior gas of the pellicle can be replaced in a short time without stagnation in the gas flow as far as possible.

It is especially preferred that the vent holes are distributed symmetrically about the centerline in the lateral direction of the side walls. When the plurality of vent holes provided on the above pellicle, are distributed symmetrically about the centerline in the lateral direction of either one of the side walls of the pellicle frame, the residual stress caused by the processing will be reduced, and the distortion of the pellicle frame itself will be less. Namely, the distortion of the photomask after mounting the pellicle on the photomask, will be small, whereby it is possible to prevent a defect such as a deformation of the pattern at the time of exposure. Further, by the symmetrical disposition of the vent holes on the side walls of the pellicle frame, formation of a strain on the pellicle membrane due to the flow of the gas in the interior of the pellicle, can be reduced, such being preferred.

Further, it is preferred to provide a dust proofing filter to cover the vent holes. It is particularly preferred to provide a filter inside the pellicle frame, whereby it is possible to prevent entrance of dust, etc. from the exterior and to remove dust, etc. floating in the interior of the pellicle.

The thickness of the pellicle frame is preferably from 1 to 3 mm. If it is thinner than this, the rigidity tends to be inadequate. If it is thicker than this, the resistance is likely to be high at the time of introduction of the inert gas. Further, the flow of the inert gas introduced tends to be turbulent, whereby it tends to be difficult to carry out the replacement efficiently.

The pellicle of the present invention is suitable for replacing the internal atmosphere by simply blowing an inert gas. Namely, replacement of the interior atmosphere of the pellicle can be facilitated by blowing an inert gas from outside of one of the side walls having vent holes formed.

As the inert gas, $N_2$ gas or a rare gas such as Ar or He, may be used. Especially it is preferred to use $N_2$ gas from the viewpoint of availability and low cost.

In order to secure the transmittance of a $F_2$ laser (wavelength: 157 nm) in the interior of the pellicle, it is preferred to adjust $O_2$ in the interior of the pellicle to be at most 20 ppm, whereby the transmittance in the interior of the pellicle can be made to be at least 99.9%/cm. A more preferred $O_2$ concentration in the interior of the pellicle is at most 10 ppm.

The pellicle frame in the pellicle of the present invention can be produced by the following procedure. For example, in order to secure parallelism in the direction of the height, the upper and lower end faces of a plate material made of synthetic quartz glass, are mirror-polished by means of abrasive grains made of e.g. diamond, cerium oxide, silica or alumina, and then by means of an end mill, the plate material is cut into a rectangular shape in a predetermined pellicle frame thickness. The outer periphery is ground by resin/diamond. Especially when the side walls of the pellicle frame are mirror-polished by cerium, possible formation of dust can be reduced, such being desirable. Finally, a plurality of vent holes are formed by means of a drill. Further, with a view to eliminating micro-cracks of the pellicle frame, it is preferred to immerse the pellicle frame in an etching tank to subject the entire pellicle frame to etching.

Now, the present invention will be described in further detail with reference to Examples. However, it should be understood that the present invention is by no means restricted to such specific Examples.

EXAMPLES 1 to 5

From a mirror-polished flat plate made of quartz glass and having a thickness of 4.2 mm, a rectangular frame body having an external dimension of 149 mm×122 mm and an internal dimension of 145 mm×118 mm, was cut out by means of an end mill. Each corner was rounded with a radius of 5 mm, and further, the side walls were polished with diamond abrasive grains to obtain a pellicle frame having a height of 4.0 mm and having the entire surface mirror-polished. On each of the opposing side walls of the pellicle frame, four vent holes having a hole size as identified in Table 1, were formed, and then, the degree of flatness of the contact face with the pellicle sheet was measured by a three dimensional measuring machine in accordance with evaluation method 1 which will be described hereinafter. Further, by means of a fluorine type adhesive, a pellicle sheet made of synthetic quartz glass of a flat shape and having a thickness of 0.8 mm and a size corresponding to the exterior dimension of the pellicle frame, was mounted and bonded.

EXAMPLE 6

A rectangular frame body having an external dimension of 149 mm×122 mm and an internal dimension of 145 mm×118 mm was cut out from a flat plate made of aluminum and having a thickness of 4.2 mm, each corner was rounded with a radius of 5 mm, and further, the upper and lower end faces were polished by means of diamond abrasive grains to obtain a pellicle frame having a height of 4.0 mm. On each of the opposing side walls of the pellicle frame, four vent holes having a hole size of 2.4 mm, were formed, and then, the degree of flatness of the contact face with a pellicle sheet, was measured by a three dimensional measuring machine in accordance with evaluation method 1 which will be described hereinafter. Further, by means of a fluorine type adhesive, a pellicle sheet made of synthetic quartz glass of a flat shape and having a thickness of 0.8 mm and a size corresponding to the exterior dimension of the pellicle frame, was mounted and bonded.

The pellicle finished as in Examples 1 to 6, was bonded to a photomask by means of a fluorine type adhesive, and a pellicle mount test was carried out in accordance with evaluation method 2 which will be described hereinafter, to examine micro-cracks on the pellicle frame. The results are shown in Table 1.

TABLE 1

| | Size of holes on side walls of the pellicle frame (mm) | Degree of surface flatness ($\mu$m) | Number of micro-cracks on the side walls of the pellicle frame |
|---|---|---|---|
| Example 1 | 1.6 | 0.17 | 0 |
| Example 2 | 2.4 | 0.33 | 0 |
| Example 3 | 3.0 | 1.55 | 4 |
| Example 4 | 3.2 | 2.65 | 10 |
| Example 5 | 3.5 | 4.51 | Fractured |
| Example 6 | 2.4 | 7.51 | 0 |

Evaluation Method 1

By means of a three dimensional measuring machine UAP-5 (manufactured by Matsushita Electric Industrial Co., Ltd.), the degree of flatness of the end surface of the pellicle frame was measured within a range of 1.5 mm×120 mm.

Evaluation Method 2

By means of a pellicle mounter M515k (manufactured by Matsushita Seiki K.K.), a pellicle was bonded to a pellicle frame under a load of 30 kg (16197 Pa), whereupon cracks on the external peripheral side surface of the pellicle frame were visually confirmed by a light source of at least 400,000 lux.

Figure 4:
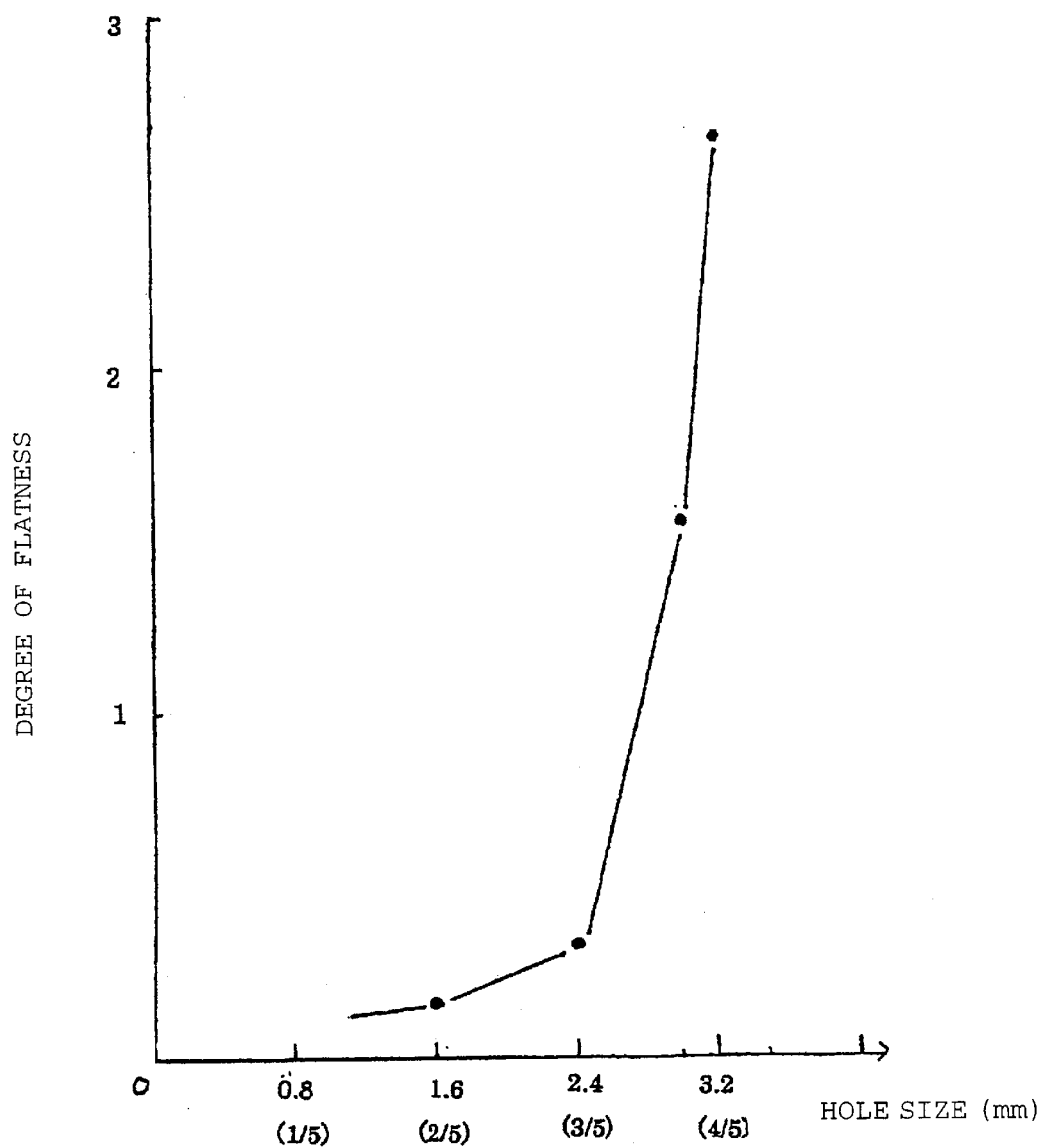
FIG. 4 is a graph showing the relation between the size of vent holes and the degree of flatness.

FIG. 4 shows the results relating to the degree of flatness. In the brackets ( ) on the abscissa, a ratio of the size of vent holes in the direction of the height of the pellicle frame, to the height of the pellicle frame, is shown. It is evident that if this ratio exceeds $3/5$, the degree of flatness sharply deteriorates.

As described in the foregoing, according to the present invention, it is possible to reduce a distortion of a pellicle due to the load at the time of mounting and to minimize a deformation of the pellicle frame due to the residual stress caused by the processing to form vent holes. Further, replacement of the atmosphere in the pellicle by simply blowing an inert gas, can be facilitated.

In the present invention, it is most preferred to employ quartz glass as the material for the pellicle frame. In a case where synthetic quartz glass is used as the pellicle sheet, it is possible to use, instead of quartz glass, a material such as low expansion glass, ceramics or crystallized glass, which has a thermal expansion coefficient substantially equal to quartz glass (specifically an average thermal expansion coefficient from 50 to 300° C. of from $1\times10^{-7}$ to $40\times10^{-7}/°$ C., particularly a linear thermal expansion coefficient within ±50% of the linear thermal expansion coefficient of quartz glass).

The entire disclosure of Japanese Patent Application No. 2001-229527 filed on Jul. 30, 2001 including specification, claims, drawings and summary are incorporated herein by reference in its entirety.

What is claimed is:

1. A pellicle comprising a box-shaped pellicle frame having top and bottom openings, and a pellicle sheet bonded to the pellicle frame to cover one of the openings of the pellicle frame, wherein the pellicle frame is made of quartz glass, a plurality of vent holes are formed as distributed on opposing side walls of the pellicle frame, and the size of the vent holes in the direction of the height of the pellicle frame is at most $3/5$ of the height of the pellicle frame.

2. The pellicle according to claim 1, wherein the size of the vent holes in the direction of the height of the pellicle frame is at least $1/5$ of the height of the pellicle frame.

3. The pellicle according to claim 1, wherein the pellicle sheet is made of synthetic quartz glass.

4. The pellicle according to claim 1, wherein the vent holes are circular.

5. The pellicle according to claim 1, wherein the vent holes are distributed symmetrically about the center line in the lateral direction of the side walls.

6. The pellicle according to claim 1, wherein the height of the pellicle frame is from 1 to 3 mm.

7. The pellicle according to claim 1, which is used for exposure by a light having a wavelength of at most 220 nm.

8. The pellicle according to claim 7, which is used for exposure by a $F_2$ laser beam.

9. The pellicle according to claim 3, wherein as the material for the pellicle frame, a material having a thermal expansion coefficient substantially equal to quartz glass is used instead of the quartz glass.

\* \* \* \* \*